(12) United States Patent
Han et al.

(10) Patent No.: US 11,575,878 B2
(45) Date of Patent: Feb. 7, 2023

(54) DISPLAY DEVICE AND METHOD FOR PROVIDING VR IMAGE

(71) Applicant: SAMSUNG ELECTRONICS CO., LTD., Suwon-si (KR)

(72) Inventors: Soon-seob Han, Seoul (KR); Chang-yeong Kim, Seoul (KR); Jae-woo Ko, Uiwang-si (KR); Yong-gyoo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 804 days.

(21) Appl. No.: 16/076,255

(22) PCT Filed: Oct. 19, 2016

(86) PCT No.: PCT/KR2016/011725
§ 371 (c)(1),
(2) Date: Aug. 7, 2018

(87) PCT Pub. No.: WO2017/159945
PCT Pub. Date: Sep. 21, 2017

(65) Prior Publication Data
US 2021/0191680 A1    Jun. 24, 2021

(30) Foreign Application Priority Data

Mar. 14, 2016 (KR) .......................... 10-2016-0030435

(51) Int. Cl.
*G06F 3/14* (2006.01)
*H04N 13/30* (2018.01)
(Continued)

(52) U.S. Cl.
CPC ........... *H04N 13/30* (2018.05); *G06F 1/1647* (2013.01); *G06F 3/0482* (2013.01);
(Continued)

(58) Field of Classification Search
CPC .... G06F 1/1647; G06F 3/1423; G06F 3/0482; G06F 2370/22; G06F 3/0488;
(Continued)

(56) References Cited

U.S. PATENT DOCUMENTS 6,822,623 B2   11/2004  Kim et al.
9,097,893 B2    8/2015  Murakami
(Continued)

FOREIGN PATENT DOCUMENTS

JP      2012-177897 A      9/2012
KR   10-2002-0088226 A    11/2002
(Continued)

OTHER PUBLICATIONS

International Search Report dated Feb. 22, 2017 issued by the International Searching Authority in counterpart Application No. PCT/KR2016/011725 (PCT/ISA/210).
(Continued)

*Primary Examiner* — Abbas I Abdulselam
(74) *Attorney, Agent, or Firm* — Sughrue Mion, PLLC

(57) ABSTRACT

Provided is a display device including: left and right displays that are spaced apart from each other; left and right lens groups respectively located at the rear of the left display and the rear of the right display; left and right display housings configured to surround the left and right displays and the left and right lens groups; a main frame provided between the left and right display housings; a connection structure capable of adjusting an angle between the main frame and a connector electrically connected to an external electronic device; and electronic components provided inside the main frame.

11 Claims, 14 Drawing Sheets

(51) Int. Cl.
*G06F 1/16* (2006.01)
*G06F 3/0482* (2013.01)
*G06F 3/0488* (2022.01)
*G09G 3/00* (2006.01)
*H05K 5/00* (2006.01)
*H05K 5/02* (2006.01)

(52) U.S. Cl.
CPC .......... *G06F 3/0488* (2013.01); *G06F 3/1423* (2013.01); *G09G 3/003* (2013.01); *H05K 5/0017* (2013.01); *H05K 5/0217* (2013.01); *G09G 2354/00* (2013.01); *G09G 2370/06* (2013.01); *G09G 2370/22* (2013.01)

(58) Field of Classification Search
CPC .... G09G 3/003; G09G 2370/22; H04N 13/30; G02B 30/22; H05K 5/0017
See application file for complete search history.

(56) References Cited

U.S. PATENT DOCUMENTS

| | | | |
|---|---|---|---|
| 9,568,806 B2 | 2/2017 | Kim et al. | |
| 9,638,920 B2 | 5/2017 | Bohn | |
| 10,027,951 B2 | 7/2018 | Kang et al. | |
| 2006/0132382 A1* | 6/2006 | Jannard | H04R 1/1066 |
| | | | 345/8 |
| 2014/0098129 A1* | 4/2014 | Fein | G06T 19/006 |
| | | | 345/633 |
| 2014/0240347 A1* | 8/2014 | Murakami | G06F 3/011 |
| | | | 345/629 |
| 2015/0128292 A1 | 5/2015 | Malecki et al. | |
| 2016/0011425 A1* | 1/2016 | Thurber | G06F 3/012 |
| | | | 345/8 |
| 2016/0057410 A1* | 2/2016 | Huang | G02B 30/24 |
| | | | 348/53 |
| 2016/0284129 A1* | 9/2016 | Nishizawa | G06F 3/013 |
| 2020/0204670 A9* | 6/2020 | Hoellwarth | G09G 5/377 |

FOREIGN PATENT DOCUMENTS

| | | |
|---|---|---|
| KR | 10-2011-0080915 A | 7/2011 |
| KR | 10-2012-0033723 A | 4/2012 |
| KR | 10-2013-0061511 A | 6/2013 |
| KR | 10-2013-0141993 A | 12/2013 |
| KR | 10-2014-0001722 A | 1/2014 |
| KR | 10-2014-0107122 A | 9/2014 |
| KR | 10-2015-0143756 A | 12/2015 |

OTHER PUBLICATIONS

Written Opinion dated Feb. 22, 2017 issued by the International Searching Authority in counterpart Application No. PCT/KR2016/011725 (PCT/ISA/237).
Communication dated Jun. 20, 2022 issued by the Korean Intellectual Property Office in Korean Application No. 10-2016-0030435.
Communication dated Dec. 15, 2022 issued by the Korean Intellectual Property Office in Korean English Patent Application No. 10-2016-0030435.

* cited by examiner (LOCK) (UNLOCK)

(LOCK) (UNLOCK)

DISPLAY DEVICE AND METHOD FOR PROVIDING VR IMAGE

TECHNICAL FIELD

The present disclosure relates to a display device and a method of providing a virtual reality (VR) image.

BACKGROUND ART

A user may view an image obtained by capturing a 3-dimensional (3D) space, by wearing a virtual reality (VR) device on his or her head. The user may turn his or her head while viewing the image and the VR device reproduces the image according to a direction in which the user's head is facing.

The VR device is manufactured to be wearable on the head, and the user may view a VR image while wearing the VR device on his or her head. The VR image is a 360° rotatable image.

DESCRIPTION OF EMBODIMENTS

Technical Problem

Provided are a display device and a method of providing a virtual reality (VR) image.

Also, provided is a computer-readable recording medium having recorded thereon a program which, when executed by a computer, performs the method.

Solution to Problem

According to an aspect of the present disclosure, a display device includes: left and right displays that are spaced apart from each other; left and right lens groups respectively located at the rear of the left display and the rear of the right display; left and right display housings configured to surround the left and right displays and the left and right lens groups; a main frame provided between the left and right display housings; a connection structure capable of adjusting an angle between the main frame and a connector electrically connected to an external electronic device; and electronic components provided inside the main frame.

According to another aspect of the present disclosure, a method of providing, by an electronic device, a virtual reality (VR) image to a display device, the method includes: identifying a connection between the electronic device and the display device; displaying a list of VR images; receiving, from a user, an input of selecting a VR image from the list; changing a display mode to a touch mode; and transmitting the VR image to the display device, wherein the transmitting of the VR image includes transmitting a changed VR image according to a touch input received from the user in the touch mode.

BEST MODE

Figure 1:
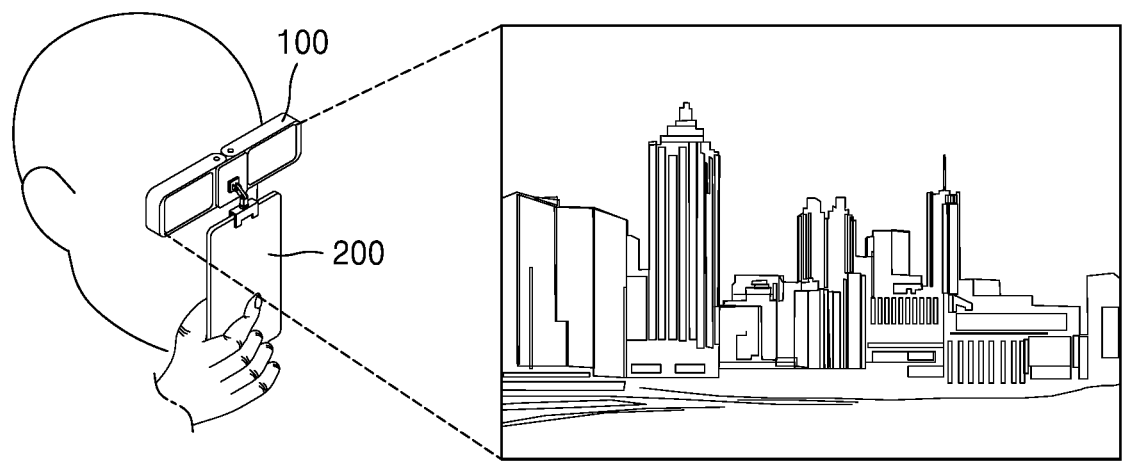
FIG. 1 is a schematic diagram for describing a method of providing a virtual reality (VR) image, according to an embodiment.

One or more embodiments of the present disclosure will now be described more fully with reference to the accompanying drawings. However, the one or more embodiments of the present disclosure may be embodied in many different forms, and should not be construed as being limited to the embodiments set forth herein; rather, these embodiments are provided so that this disclosure will be thorough and complete, and will fully convey the concept of the one or more embodiments of the present disclosure to those of ordinary skill in the art. In the following description, well-known functions or constructions are not described in detail since they would obscure the one or more embodiments of the present disclosure with unnecessary detail, and like reference numerals in the drawings denote like or similar elements throughout the specification.

All terms including descriptive or technical terms which are used herein should be construed as having meanings that are obvious to one of ordinary skill in the art. However, the terms may have different meanings according to an intention of one of ordinary skill in the art, precedent cases, or the appearance of new technologies. Also, some terms may be arbitrarily selected by the applicant, and in this case, the meaning of the selected terms will be described in detail in the detailed description of the disclosure. Thus, the terms used herein have to be defined based on the meaning of the terms together with the description throughout the specification.

It will be understood that although the terms "first", "second", etc. may be used herein to describe various components, these components should not be limited by these terms. These components are only used to distinguish one component from another.

The terms used in the present specification are merely used to describe particular embodiments, and are not intended to limit the present disclosure. An expression used in the singular encompasses the expression in the plural, unless it has a clearly different meaning in the context. Also, in the specification, when a region is "connected" to another region, the regions may not only be "directly connected", but may also be "electrically connected" via another device therebetween. Also, when a part "includes" or "comprises" an element, unless there is a particular description contrary thereto, the part can further include other elements, not excluding the other elements.

The use of the terms "a" and "an" and "the" and similar referents in the context of describing the disclosure (especially in the context of the following claims) are to be construed to cover both the singular and the plural. Also the steps of all methods described herein can be performed in any suitable order unless otherwise indicated herein or otherwise clearly contradicted by context.

The phrase "some embodiments" or "an embodiment" used variously herein does not necessarily indicate the same embodiment.

Some embodiments of the present disclosure may be described in terms of functional block components and various processing steps. Such functional blocks may be realized by any number of hardware and/or software components configured to perform the specified functions. For example, the present disclosure may be implemented by one or more microprocessors or by circuit components for certain functions. Also, for example, the functional blocks of the present disclosure may be implemented using any programming or scripting language. The functional blocks may be implemented in algorithms that execute on one or more processors. Furthermore, the present disclosure could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

Hereinafter, the present disclosure will be described in detail with reference to accompanying drawings.

FIG. 1 is a schematic diagram for describing a method of providing a virtual reality (VR) image, according to an embodiment. A user may view a VR image through a display device 100. An electronic device 200 may transmit the VR image to the display device 100, and the display device 100 may reproduce the VR image.

The user may view the VR image without having to fix the display device 100 on a head. The display device 100 does not include a structure being supported by the head of the user. Alternatively, the display device 100 is fixed to the electronic device 200. The user may view the VR image by holding the display device 100 to the eyes while holding the electronic device 200.

The user may rotate the VR image by touching a screen of the electronic device 200. The electronic device 200 receives a touch input of the user, and determines a direction of the VR image according to a direction of the touch input. The electronic device 200 may transmit the VR image to the display device 100 according to the determined direction. Accordingly, the user may rotate the VR image via the touch input, without having to rotate the head.

Figure 2:
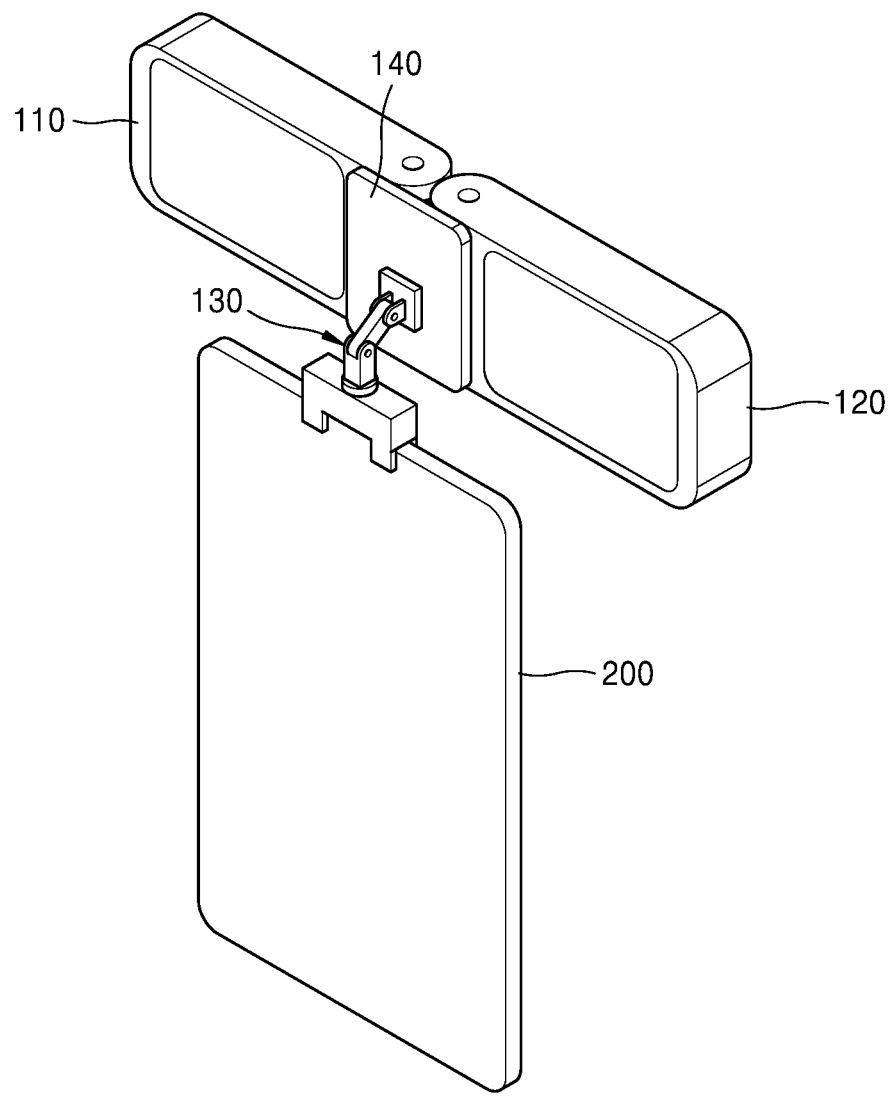
FIG. 2 is a diagram for describing a connection between a display device and an electronic device, according to an embodiment.

FIG. 2 is a diagram for describing a connection between a display device and an electronic device, according to an embodiment. Referring to FIG. 2, the display device 100 and the electronic device 200 are connected to each other via a connection structure 130. The connection structure 130 may maintain positions of the display device 100 and the electronic device 200.

The display device 100 includes a left display housing 110, a right display housing 120, the connection structure 130, and a main frame 140. The left display housing 110 is configured to surround a left display and a left lens group. The right display housing 120 is configured to surround a right display and a right lens group.

The connection structure 130 fixes the electronic device 200 and the display device 100 to each other. The connection structure 130 includes a holder 134, and the electronic device 200 and the display device 100 are fixed by using the holder 134.

An angle of the connection structure 130 may be adjustable with respect to the main frame 140. An angle of the connection structure 130 may be adjusted. Also, an external structure may be rotatable in an axial direction with respect to the main frame 140. Angle adjustment and rotation of the connection structure 130 are described in detail with reference to FIGS. 3 and 4.

Figure 3:
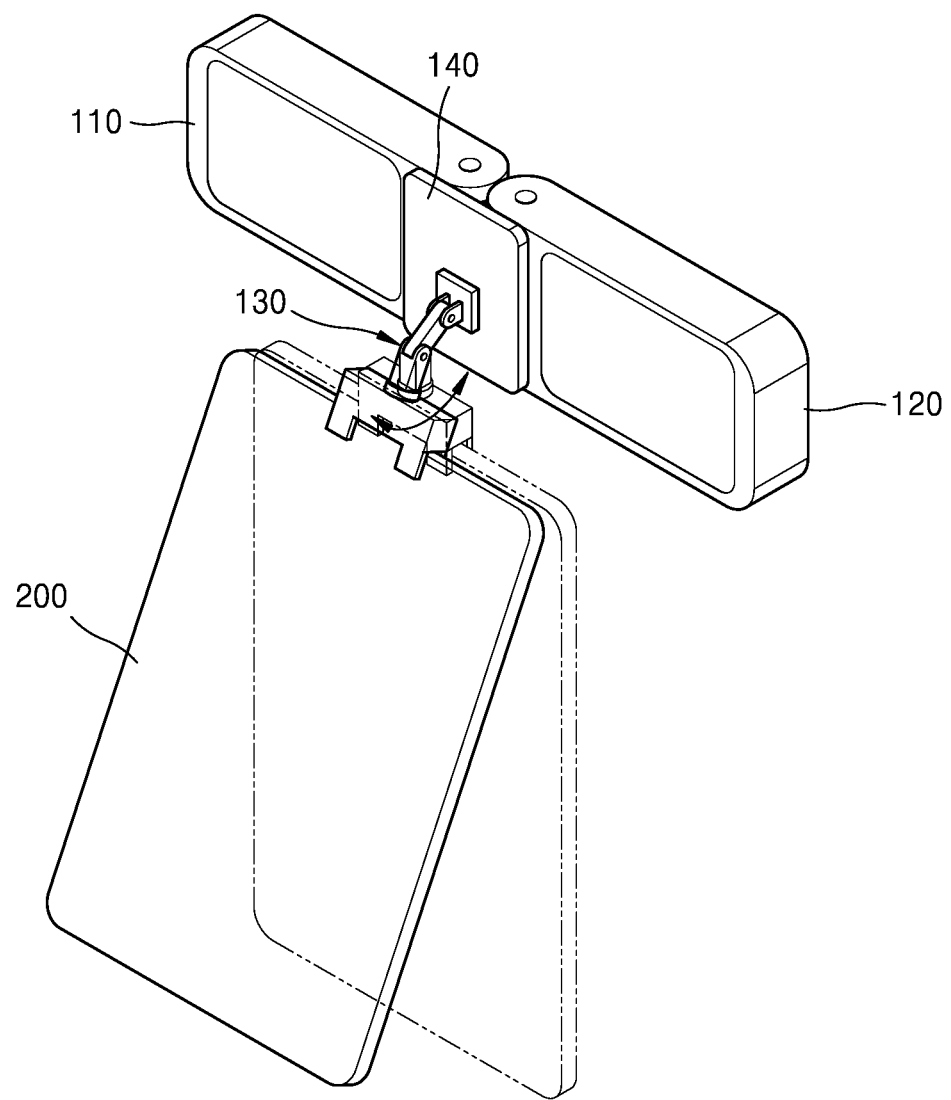
FIG. 3 is a diagram for describing adjusting an angle of a display device, according to an embodiment.

FIG. 3 is a diagram for describing adjusting an angle of a display device, according to an embodiment.

The angle of the connection structure 130 of the display device 100 is adjustable back and forth. The connection structure 130 includes at least one hinge. The user may connect the display device 100 and the electronic device 200, and then adjust an angle between the display device 100 and the electronic device 200 by using the hinge. The hinge includes a friction member having a frictional force, and the angle is adjusted only when a force equal to or stronger than certain strength is applied. Accordingly, the angle is fixed as long as the user does not apply the force equal to or stronger than the certain strength. For example, the friction member may be a friction pad or a spring.

When the connection structure 130 includes two hinges, the user may adjust each of an angle between the display device 100 and the connection structure 130 and an angle between the electronic device 200 and the connection structure 130. The user may adjust an angle to be most comfortable when the electronic device 200 is held and the display device 100 is brought close to the face.

Figure 4:
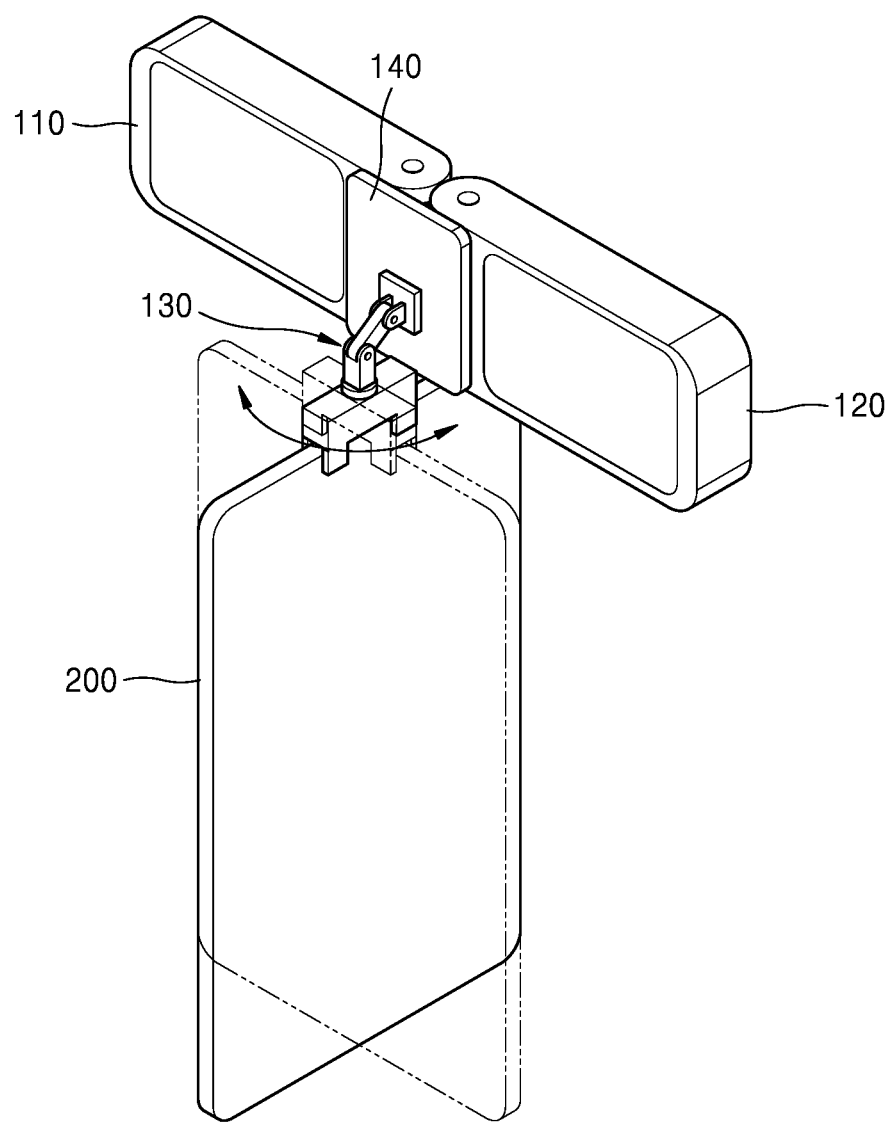
FIG. 4 is a diagram for describing rotating a display device, according to an embodiment.

FIG. 4 is a diagram for describing rotating a display device, according to an embodiment.

The connection structure 130 of the display device 100 is rotatable 360° around a shaft. The connection structure 130 may further include a bearing structure, and the user may rotate the display device 100 and the electronic device 200 around the shaft by using the bearing structure. A rotating direction of a bearing is a direction perpendicular to a rotating direction of the hinge.

Figure 5:
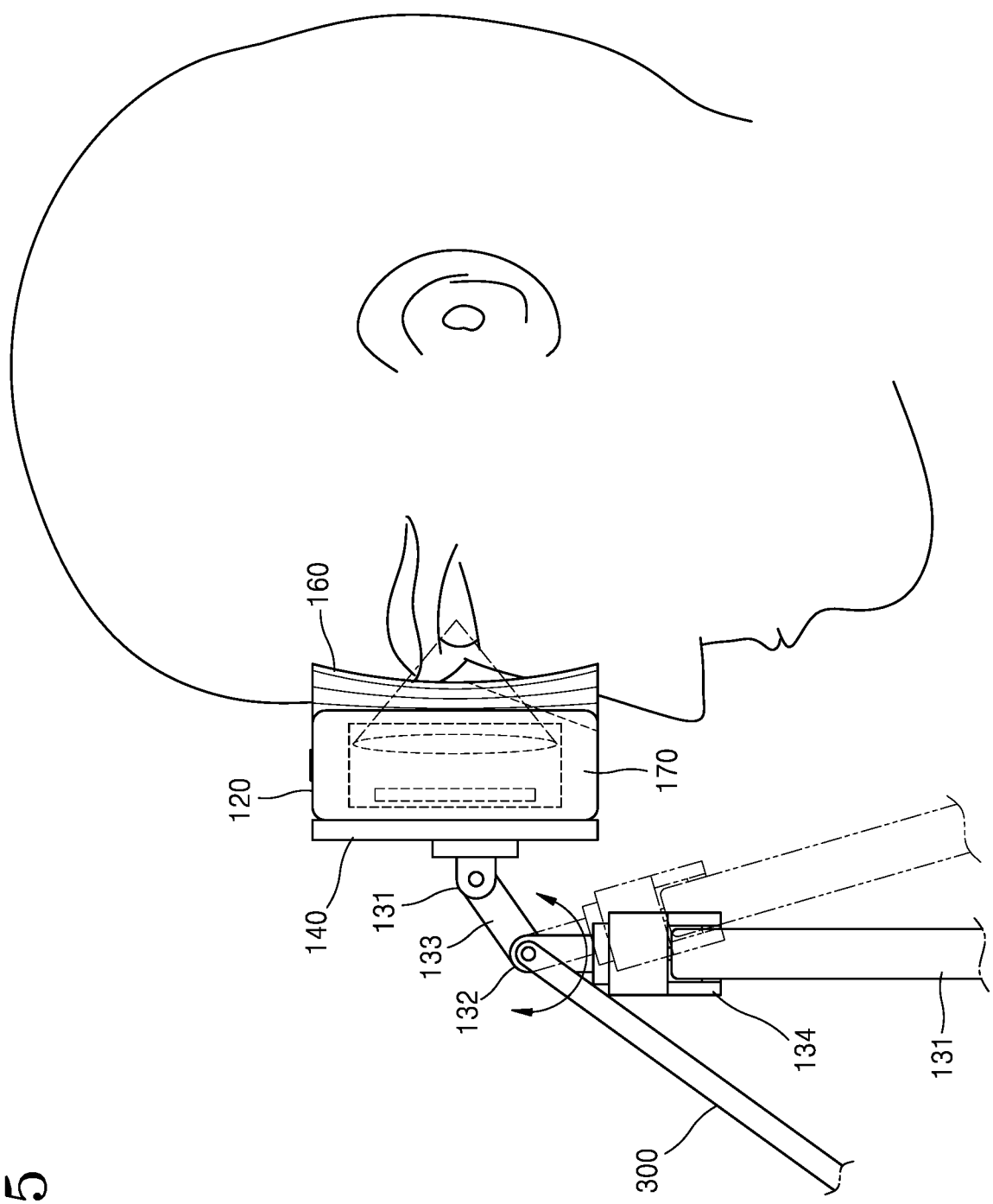
FIG. 5 is a diagram for describing a display device according to an embodiment.

FIG. 5 is a diagram for describing a display device according to an embodiment.

The display device 100 includes an arm structure. The arm structure includes first and second hinges 131 and 132, and the first and second hinges 131 and 132 are connected by a bar 133. The first hinge 131 adjusts an angle between the bar 133 and the main frame 140. The second hinge 132 adjusts an angle between the bar 133 and the electronic device 200. The second hinge 132 is connected to the main frame 140.

The holder 134 fixes the display device 100 and the electronic device 200. The holder 134 may be manufactured in such a manner that the outside of the electronic device 200 may be held, but a form of the holder 134 is not limited thereto, and any form capable of fixing the display device 100 and the electronic device 200 may be used.

An auxiliary support 300 may be connected to the first hinge 131 or the second hinge 132. In FIG. 5, the auxiliary support 300 is connected to the second hinge 132. The user may adjust an angle between the auxiliary support 300 and the display device 100.

The auxiliary support 300 may be attached to or detached from the display device 100. The user may use the auxiliary support 300 by attaching the auxiliary support 300 to the connection structure 130 only when required. The auxiliary support 300 may be used to prevent the arm of the user from becoming numb when the user is viewing the VR image for a long period of time.

The display device 100 further includes a contact structure 160. The contact structure 160 is adhered to the face of the user such that the display device 100 does not shake and ambient light is blocked to enhance an immersive experience of the user.

For example, the contact structure 160 may be a bellow-type structure. Alternatively, the contact structure 160 may be formed of rubber.

The contact structure 160 may be provided to surround a left lens group 112 and a right lens group 122. Also, the contact structure 160 may be provided at the edge of the left and right display housings 110 and 120.

A nose hole 170 denotes a space where the noise of the user may be located when the user adheres the display device 100 to the face. The nose hole 170 may be formed between the left display housing 110 and the right display housing 120.

Figure 6:
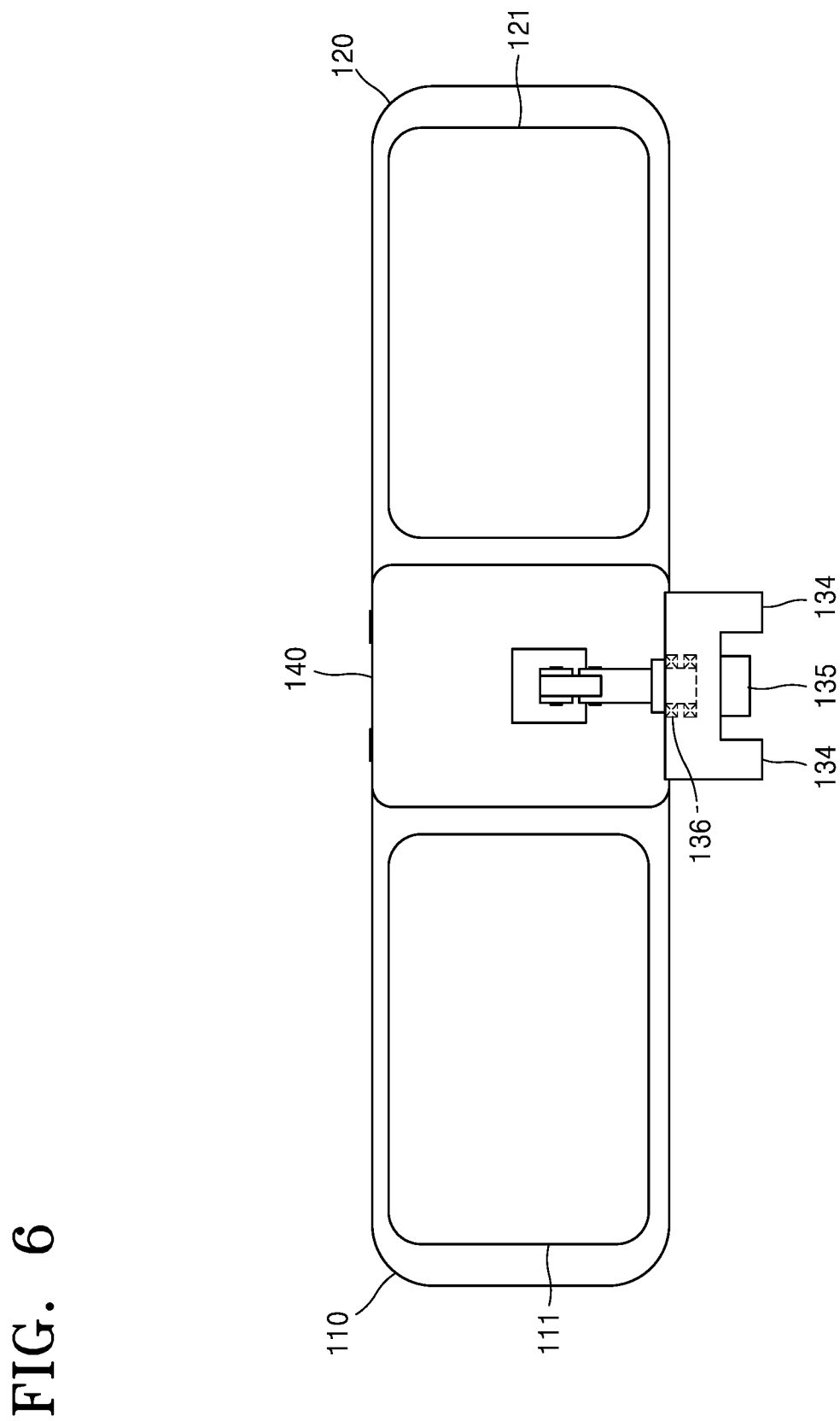
FIG. 6 is a rear diagram of a display device according to an embodiment.

FIG. 6 is a rear diagram of a display device according to an embodiment.

The main frame 140 is located at the center of the display device 100. The left display housing 110 is located at the left of the main frame 140, and the right display housing 120 is located at the right of the main frame 140.

The connection structure 130 may be connected to the main frame 140. The connection structure 130 includes the first hinge 131, the second hinge 132, the bar 133, the holder 134, and a bearing 136. The bearing 136 may have a cylindrical shape or a ball joint shape.

The connection structure 130 may surround a connector 135. The connector 135 is located inside the holder 134 to be connected to the electronic device 200. The display device 100 and the electronic device 200 exchange data or a VR image through the connector 135. The VR image is transmitted to the main frame 140 through the connector 135.

Figure 7:
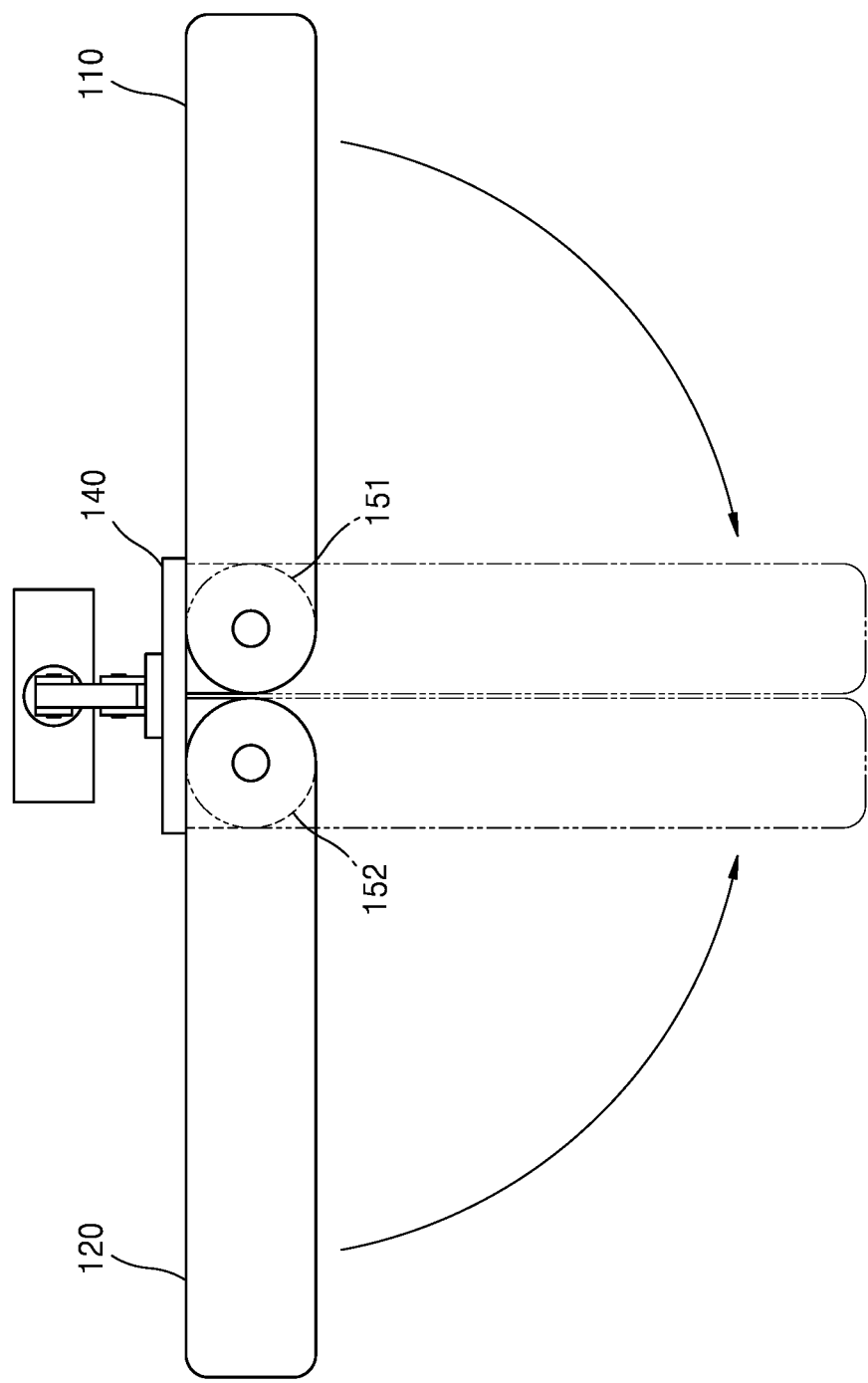
FIG. 7 is a diagram for describing folding a display device, according to an embodiment.

FIG. 7 is a diagram for describing folding a display device, according to an embodiment. As shown in FIG. 7, the left display housing 110 and the right display housing 120 are each folded by 90°. The left display housing 110 rotates 90° based on the first hinge 131 and the right display housing 120 rotates 90° based on the second hinge 132.

Figure 8:
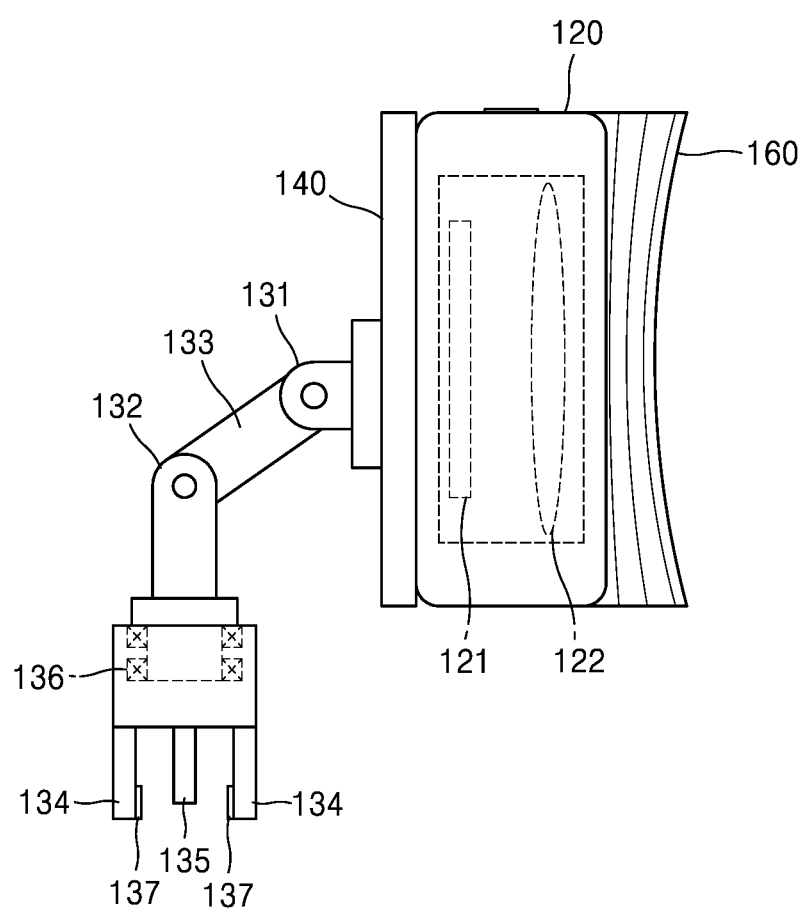
FIG. 8 is a diagram for describing a connection structure in detail.

FIG. 8 is a diagram for describing a connection structure in detail.

The holder 134 may be provided at two sides. The connector 135 may be provided between the two holders 134. The holder 134 may include a friction member 137 on a surface contacting the electronic device 200. The friction member 137 may be provided inside the holder 134. The friction member 137 may be formed of a material having high frictional coefficient, such as rubber.

The bearing 136 may have a cylindrical shape or a ball shape, and may rotate 360°.

The bearing 136 may be in a flexible state or may be fixed based on a distance between the display device 100 and the user. The flexible state denotes a state in which the display device 100 does not shake even when the user moves slightly while holding the electronic device 200. Also, the bearing 136 being fixed denotes a state in which the display device 100 is movable according to movement of the user.

The main frame 140 controls a state of the bearing 136, based on the distance between the display device 100 and the user, the distance measured by a proximity sensor. For example, a processor of the main frame 140 may control the bearing 136 to be in the flexible state when a distance between the display device 100 and the face of the user is equal to or lower than a threshold value. When the display device 100 approaches the face of the user, the processor controls the bearing 136 to be in the flexible state such that the display device 100 does not shake even when the electronic device 200 shakes.

For example, the proximity sensor may be an infrared (IR) sensor, and may be provided at the left display housing 110 or the right display housing 120. When the display device 100 does not include the proximity sensor, the display device 100 may calculate the distance between the display device 100 and the user by receiving a signal from a proximity sensor 230 of the electronic device 200.

On the other hand, the processor controls the bearing 136 to be fixed when the distance between the display device 100 and the face of the user is higher than the threshold value. When the user is not viewing a VR image, the processor may control the bearing 136 to be fixed. For example, the processor may fix the bearing 136 by applying a current to an electromagnet located around the bearing 136. When the bearing 136 is a magnetic substance, the bearing 136 and the electromagnet may be fixed via a magnetic force by applying a current to the electromagnet.

A left display 121 and a right display (not shown) may be a miniaturized display. For example, the left display 121 and the right display may be a liquid crystal display (LCD) or an organic light-emitting display (OLED).

The left lens group 112 and the right lens group 122 are lens units for enlarging an image. The left lens group 112 and the right lens group 122 each include at least one lens.

Figure 9:
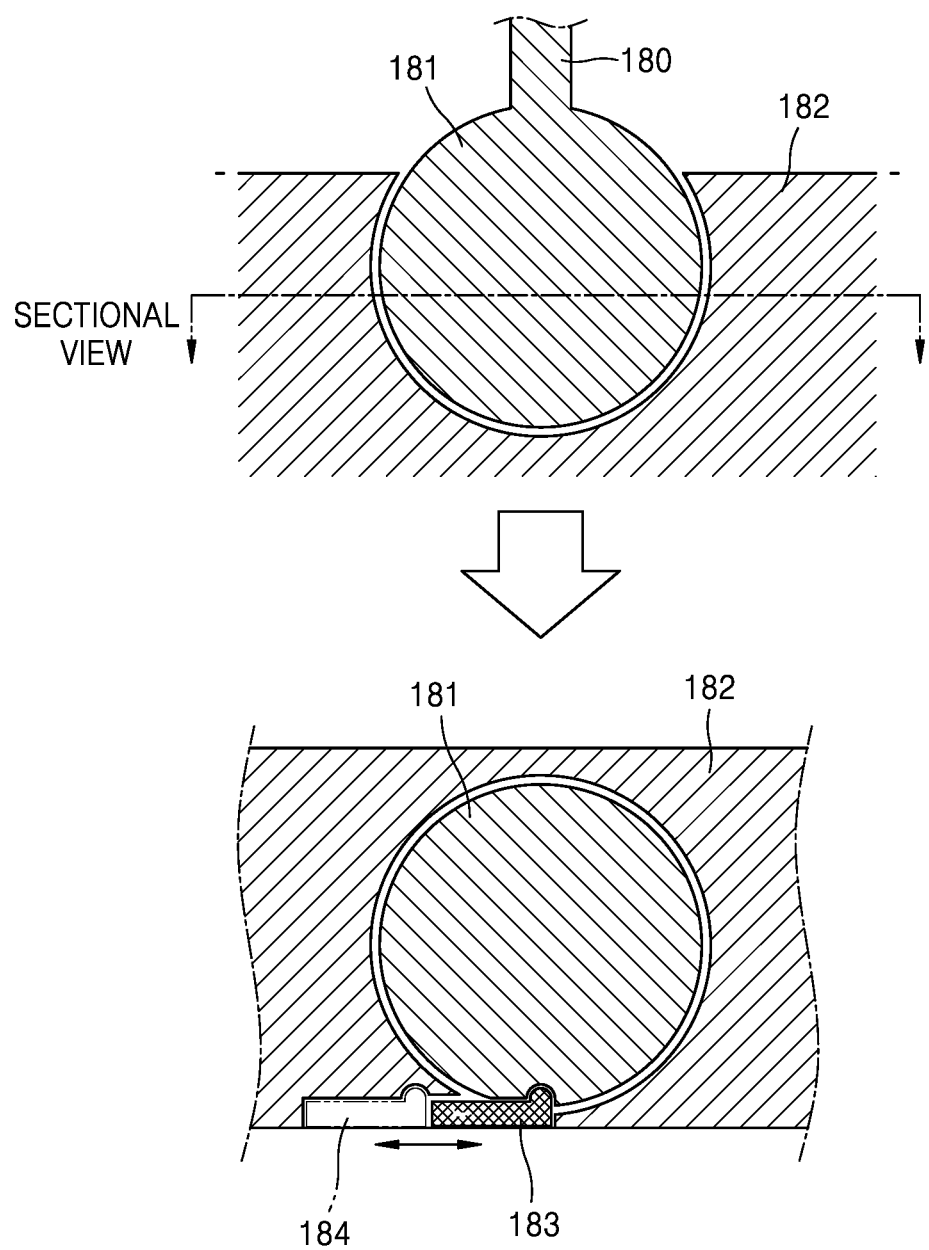
FIG. 9 is a diagram for describing a bearing according to an embodiment.

FIG. 9 is a diagram for describing a bearing according to an embodiment. A ball joint 180 of FIG. 9 may replace the bearing 136 of FIG. 7.

The connection structure 130 may include the ball joint 180. The ball joint 180 enables the display device 100 and the electronic device 200 to tilt and rotate.

The ball joint 180 includes a ball 181 and a ball housing 182. The ball housing 182 surrounds the ball 181. The ball 181 freely rotates within the ball housing 182.

Looking at a sectional view of the ball joint 180, the connection structure 130 may further include a locking lever 183. The locking lever 183 may fix the ball 181. The locking lever 183 may be in a locking position or an unlocking position 184, and may be driven by the user or electronically. For example, the locking lever 183 may move according to the distance between the display device 100 and the face of the user. When the distance between the display device 100 and the face of the user is equal to or lower than a threshold value, the locking lever 183 is arranged in the unlocking position 184. On the other hand, when the display device 100 and the face of the user is higher than the threshold value, the locking lever 183 is arranged in the locking position. The distance between the display device 100 and the face of the user may be measured by a proximity sensor. Accordingly, the locking lever 183 may be arranged in the locking position or the unlocking position 184 automatically, based on the distance measured by the proximity sensor.

The locking position is a region where the locking lever 183 is displayed in solid lines in FIG. 9, and the unlocking position 184 is a region where the locking lever 183 is displayed in broken lines in FIG. 9.

The locking lever 183 may include a protrusion, and the ball 181 may include a groove. When the protrusion is coupled to the groove, the ball 181 may no longer move and be fixed.

Figure 10:
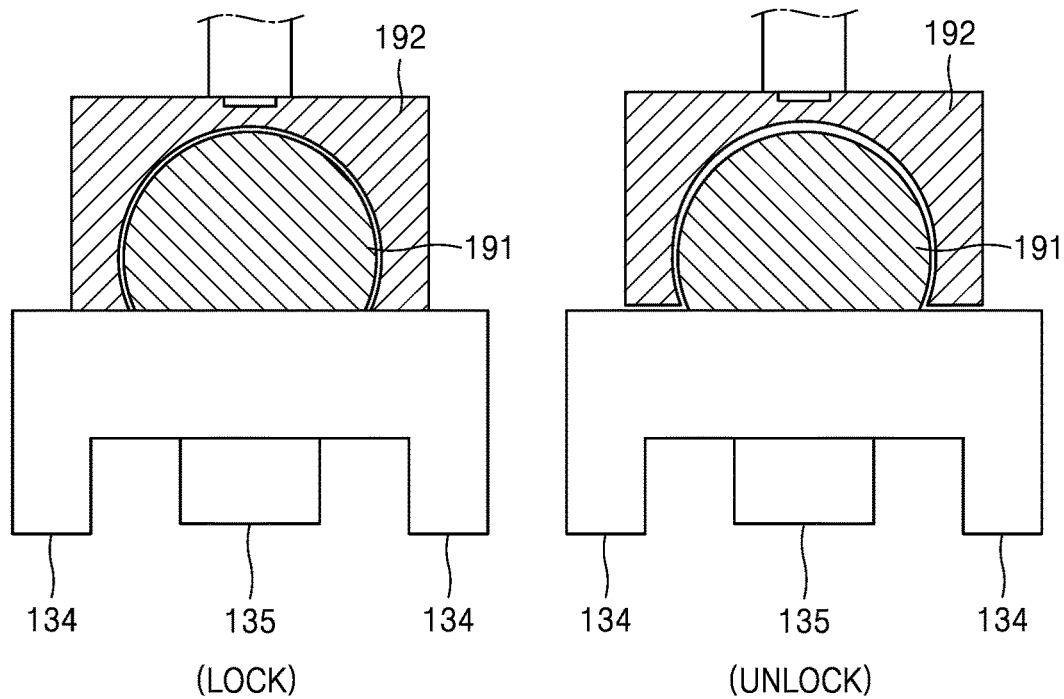
FIG. 10 is a diagram for describing a bearing according to another embodiment.

FIG. 10 is a diagram for describing a bearing according to another embodiment. Referring to FIG. 10, a ball 191 and a ball housing 192 may be spaced apart from each other by a magnetic force. The ball 191 may include a magnet. Alternatively, a surface of the ball 191 may be configured to be a magnet. The ball housing 192 include an electromagnet. The ball 191 has a magnetic property by applying electricity to the electromagnet, such that the ball 191 and the ball housing 192 have the same polarity. The ball 191 and the ball housing 192 having the same polarity are spaced apart from each other by a repulsive force.

The processor may apply a current to the electromagnet according to a signal received from the proximity sensor. The processor may calculate the distance between the display device 100 and the face of the user, based on the signal received from the proximity sensor, and apply the current to the electromagnet when the calculated distance is equal to or lower than the threshold value. In other words, while the user is viewing the VR image, the processor applies the current to the electromagnet to separate the ball 191 and the ball housing 192 so as to prevent the display device 100 from shaking due to hand shaking of the user.

Figure 11:
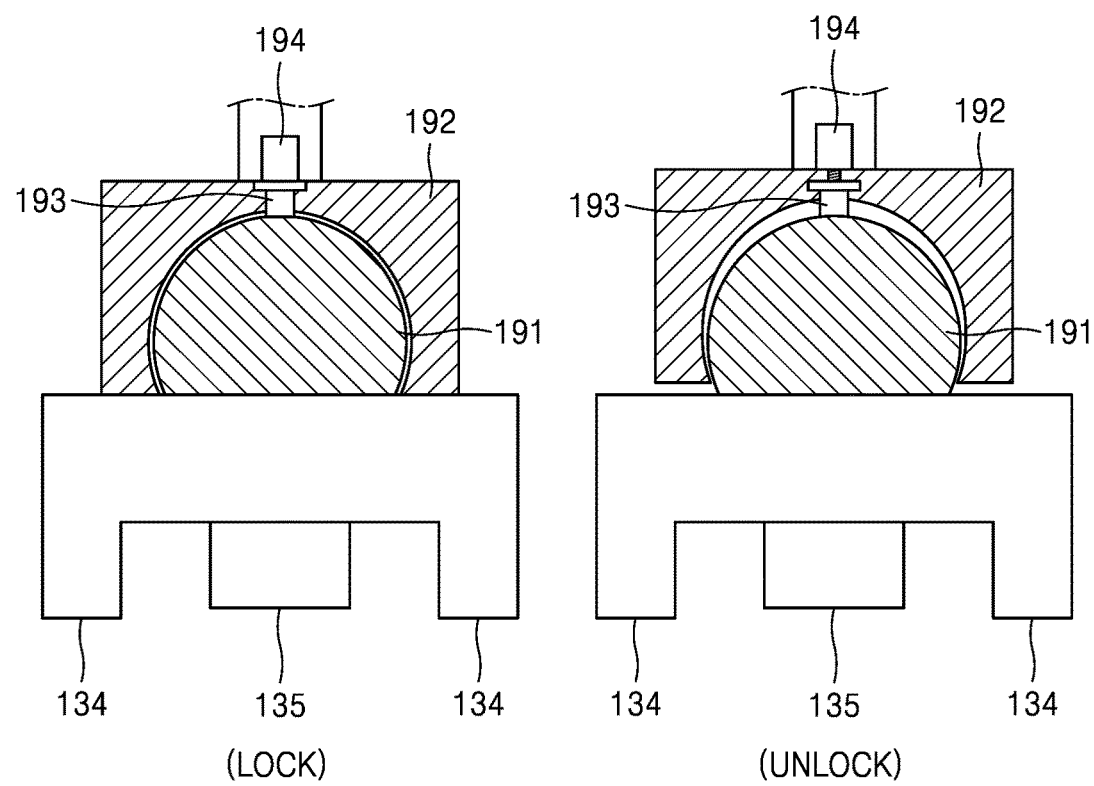
FIG. 11 is a diagram for describing a bearing according to another embodiment.

FIG. 11 is a diagram for describing a bearing according to another embodiment. Referring to FIG. 10, the ball 191 and the ball housing 192 may be spaced apart from each other by a fastener 193. The fastener 193 may be loosened or fastened with respect to the ball housing 192 by a motor 194. When the fastener 193 is fastened, the ball 191 and the ball housing 192 contact each other. When the fastener 193 is loosened, the ball 191 and the ball housing 192 are spaced apart from each other. The motor 194 is fixed to the ball housing 192, and the fastener 193 pushes the ball 191 while being loosened, and thus the ball 191 and the ball housing 192 are spaced apart from each other.

The processor may drive the motor 194 according to a signal received from the proximity sensor. The processor may calculate the distance between the display device 100 and the face of the user, based on the signal received from the proximity sensor, and drive the motor 194 when the calculated distance is equal to or lower than the threshold value. In other words, while the user is viewing a VR image, the processor may separate the ball 191 and the ball housing 192 from each other by driving the motor 194, to prevent the display device 100 from shaking due to hand shaking of the user.

Figure 12:
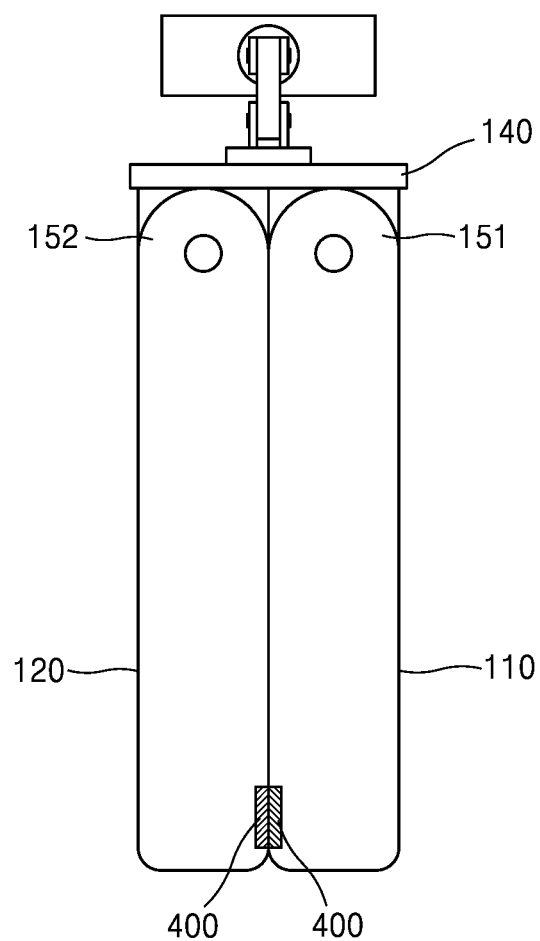
FIG. 12 is a diagram for describing an assembling structure of a display device, according to an embodiment.

FIG. 12 is a diagram for describing an assembling structure of a display device, according to an embodiment.

The left display housing 110 and the right display housing 120 may further include assembling structures 400 at the ends. The assembling structures 400 fix the left display housing 110 and the right display housing 120 when the left and right display housings 110 and 120 are folded. For example, the assembling structures 400 may include a groove and a protrusion, wherein the groove and the protrusion are coupled to be fixed to each other. The left display housing 110 may include the groove at the end, and the right display housing 120 may include the protrusion at the end.

As another example, the assembling structure 400 may be a magnet. An N-pole magnet may be provided at the end of the left display housing 110, and an S-pole magnet may be provided at the end of the right display housing 120. Accordingly, when the left and right display housings 110 and 120 are folded, the N-pole and the S-pole contact each other, and thus the left and right display housings 110 and 120 may be fixed to each other.

The groove and the protrusion, and the magnets are only examples of the assembling structure 400, and the assembling structure 400 may have any structure as long as the left and right display housings 110 and 120 are fixed to each other.

Figure 13:
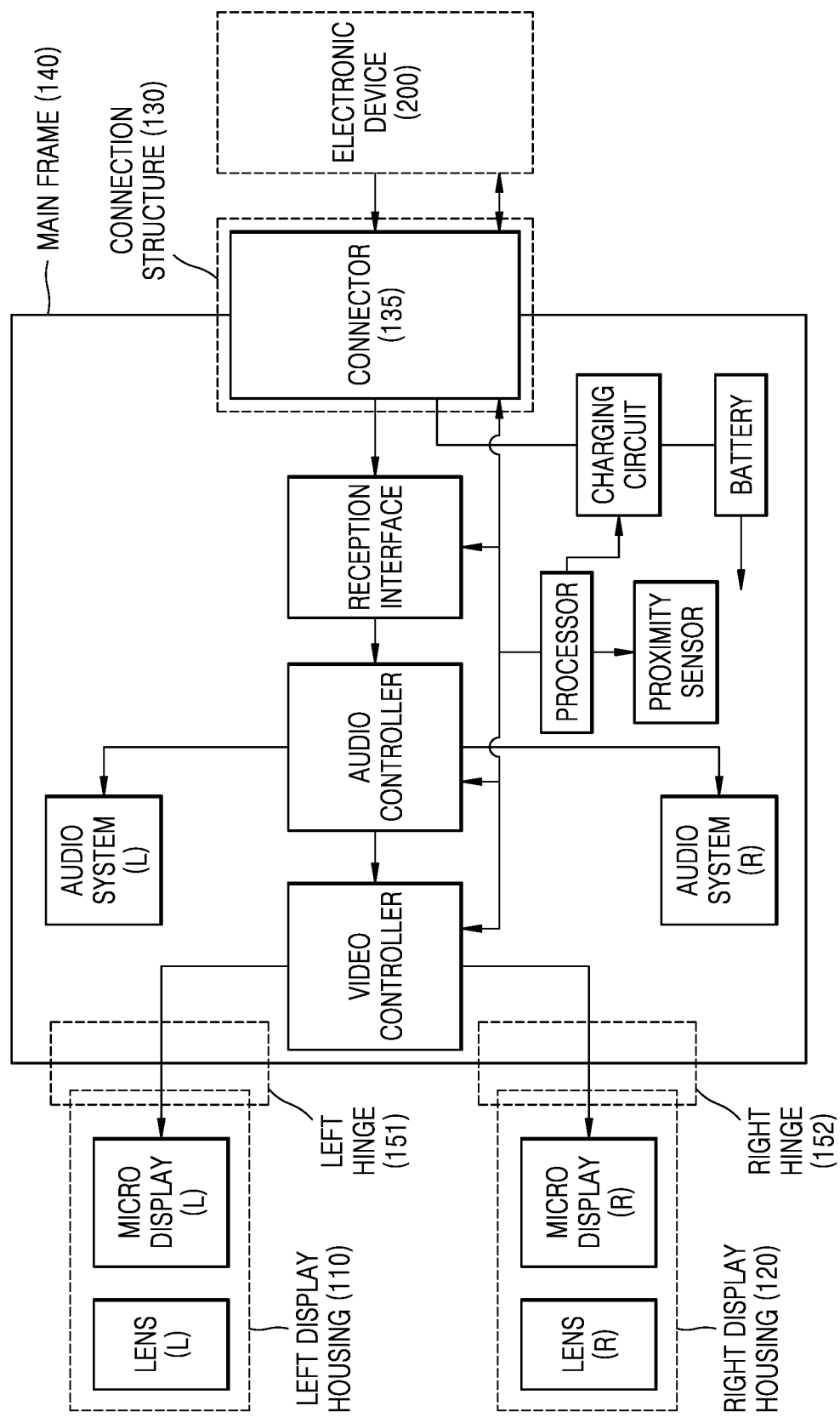
FIG. 13 is a diagram for describing a display device according to an embodiment.

FIG. 13 is a diagram for describing a display device according to an embodiment.

The left display housing 110 includes a lens (L) and a micro display (L). The left display housing 110 is configured to surround the lens (L) and the micro display (L). The left display housing 110 is connected to the main frame 140 through a left hinge 151.

The right display housing 120 includes a lens (R) and a micro display (R). The right display housing 120 is configured to surround the lens (R) and the micro display (R). The right display housing 120 is connected to the main frame 140 through a right hinge 152.

The main frame 140 includes an interface and a processor. The main frame 140 includes an audio system (L), an audio system (R), a video controller, an audio controller, a reception interface, a processor, a proximity sensor, a charging circuit, a battery, the connection structure 130, and the connector 135. The processor controls the proximity sensor, the charging circuit, the audio controller, the video controller, and the reception interface. The reception interface separates a video signal and an audio signal received from the electronic device 200. The audio controller transmits the audio signal to the left audio system (L) and the right audio system (R). The video controller transmits the video signal to the left micro display (L) and the right micro display (R).

The connector 135 is connected to the electronic device 200, and the display device 100 transmits and receives data to and from the electronic device 200 through the connector 135.

Figure 14:
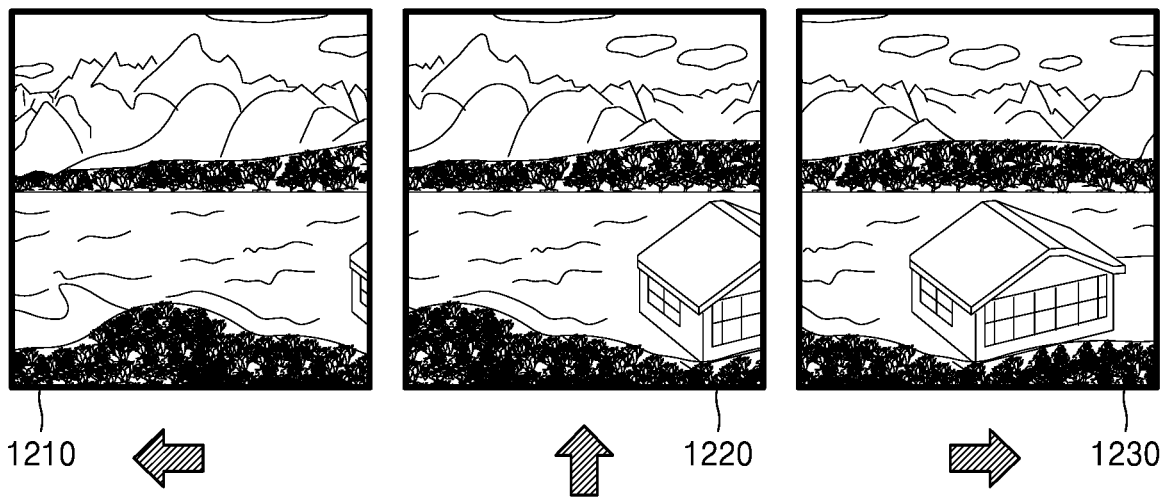
FIG. 14 is a diagram for describing a method by which a user rotates a VR image by using an electronic device.
Figure 14:
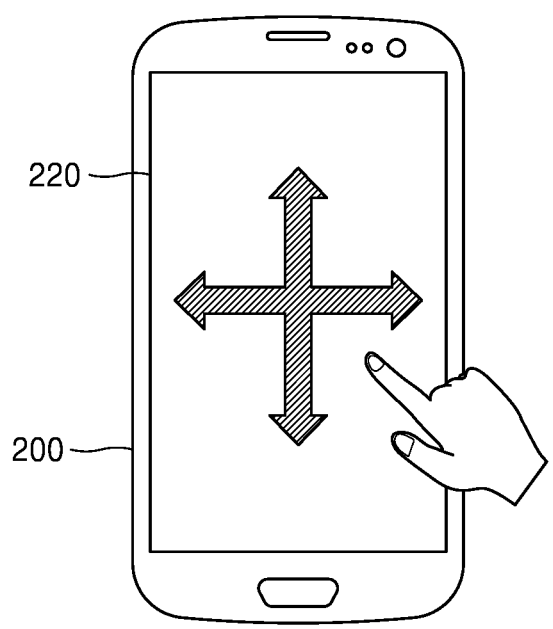

FIG. 14 is a diagram for describing a method by which a user rotates a VR image by using an electronic device. The user may rotate the VR image by touching a display 220 of the electronic device 200. The electronic device 200 may transmit the rotated VR image to the display device 100, according to a touch input of the user.

Based on a second image 1220, a first image 1210 indicates an image when the user touches left direction and a third image 1230 indicates an image when the user touches right direction.

The electronic device 200 may not only detect directions shown in FIG. 14, but also a direction of the touch input of the user, and transmit the VR image rotated in the detected direction to the display device 100.

The electronic device 200 may determine a rotating angle of the VR image, according to a dragging speed of the user. For example, the electronic device 200 may determine a larger rotating angle when the dragging speed of the user is high. On the other hand, the electronic device 200 determines a smaller rotating angle when the dragging speed of the user is low. The electronic device 200 transmits the VR image rotated in the determined rotating angle to the display device 100.

The electronic device 200 may transmit, to the display device 100, a screen in which the VR image is rotated or a viewpoint of the VR image is moved, based on a type of the touch input of the user. For example, when the user inputs a one point touch-and-drag input, the electronic device 200 rotates the VR image. When the user inputs a two points touch-and-drag input, the electronic device 200 may move the viewpoint in the VR image.

In detail, as shown in FIG. 14, when the user touches and drags the display 220 with one finger, the VR image is rotated in a dragged direction. The electronic device 200 transmits the VR image changed according to the dragged direction of the user to the display device 100.

When the user touches and drags the display 220 with two fingers, the viewpoint is moved within the VR image in a dragged direction. In other words, when the user touches and drags the display 220 with two fingers, the electronic device 200 transmits, to the display device 100, an image obtained as the viewpoint is moved forward, backward, or transversely within the VR image. For example, when the user touches the display 220 and drags from top to bottom with two fingers, the electronic device 200 transmits an image when the viewpoint is moved forward, to the display device 100. When the user touches the display 220 and then drags from left to right with two fingers, the electronic device 200 transmits an image in which the viewpoint is moved to the right, to the display device 100.

The electronic device 200 may determine a moved distance in the VR image according to a speed of the user touching two points and then dragging. For example, when a dragging speed of the user is high, the electronic device 200 may determine a long moved distance. On the other hand, when the dragging speed of the user is low, the electronic device 200 may determine a short moved distance. The electronic device 200 transmits the VR image moved by the determined moved distance, to the display device 100.

As another example, the electronic device 200 may enlarge or reduce the VR image. When the user inputs the two points touch-and-drag input, but dragged directions of the two points are not the same, the electronic device 200 may enlarge or reduce the VR image. In other words, when the dragged directions of the two points are the same, the electronic device 200 moves the viewpoint of the VR image, and when the dragged directions of the two points are not the same, the electronic device 200 enlarges or reduces the VR image.

For example, when the two points are dragged in a direction away from each other, the electronic device 200 enlarges the VR image, and when the two points are dragged in a direction approaching each other, the electronic device 200 reduces the VR image. The electronic device 200 transmits the enlarged or reduced VR image to the display device 100.

Figure 15:
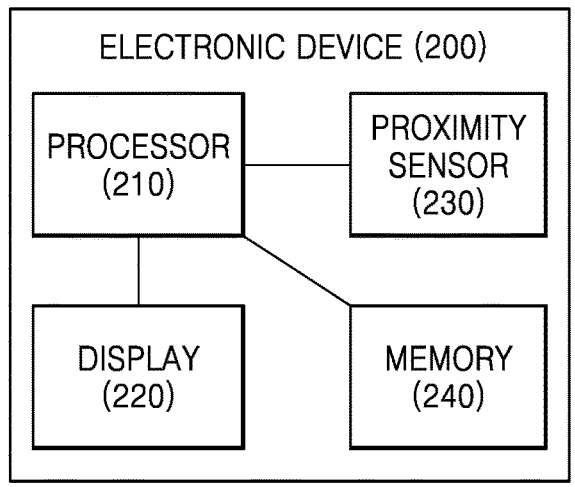
FIG. 15 is a block diagram of an electronic device according to an embodiment.

FIG. 15 is a block diagram of an electronic device according to an embodiment. In FIG. 15, the electronic device 200 includes a processor 210, the display 220, the proximity sensor 230, and a memory 240, but the electronic device 200 may further include other electronic components, a universal serial bus (USB) terminal, a mobile high-definition link (MHL) terminal, etc.

The processor 210 controls the display 220. The processor 210 determines a screen to be displayed on the display 220. The processor 210 may display lists of VR images on the display 220 after identifying a connection with the display device 100.

Also, the processor 210 executes a program or an application related to the display device 100 after identifying the connection with the display device 100. The processor 210 may access a website providing a VR image.

The user may select one VR image from a displayed list of VR images, and the processor 210 transmits the selected VR image to the display device 100. The VR image may be downloaded through the Internet or stored in a memory.

The processor 210 receives a user input from the display 220. The processor 210 may change a state of the display 220 or transmit data to the display device 100, according to the user input.

The processor 210 may transmit a VR image to the display device 100, based on a signal received from the proximity sensor 230. The proximity sensor 230 measures a distance between the electronic device 200 and the user, and outputs the measured distance to the processor 210. The processor 210 may determine whether to transmit a VR image to the display device 100, based on the measured distance. For example, the processor 210 transmits the VR image to the display device 100 when the measured distance is equal to or lower than a threshold value.

Figure 16:
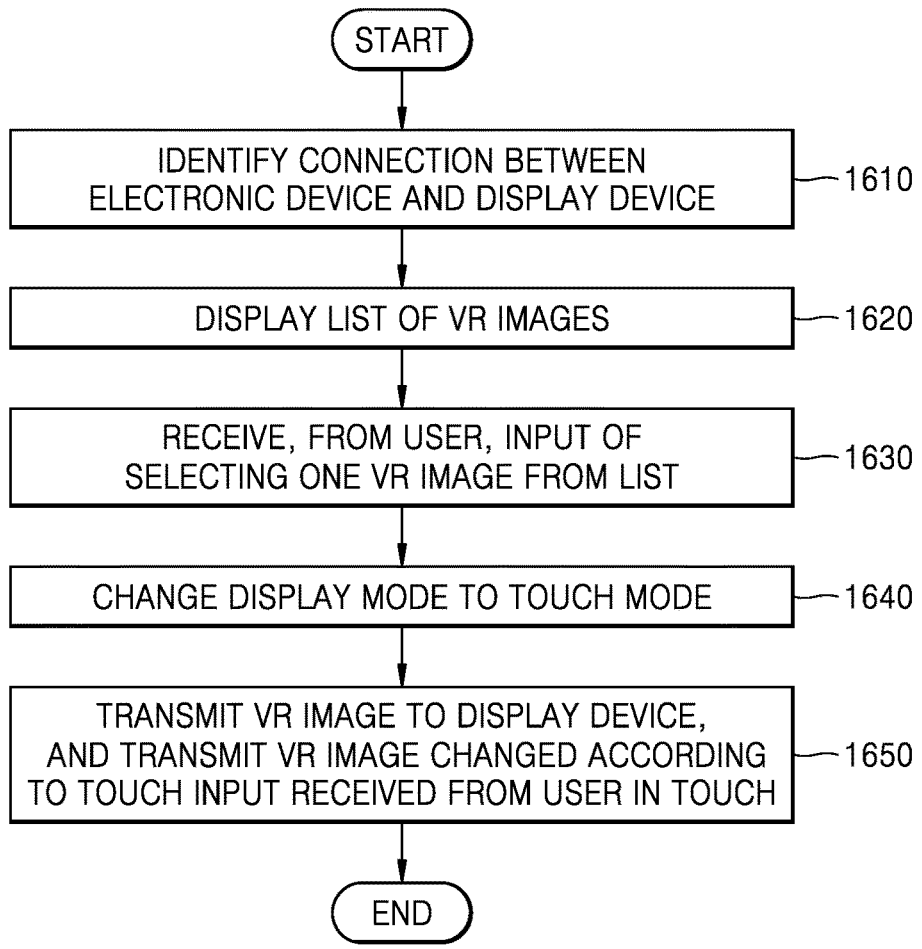
FIG. 16 is a flowchart of a method of providing a VR image, according to an embodiment.

FIG. 16 is a flowchart of a method of providing a VR image, according to an embodiment.

In operation 1610, the electronic device 200 identifies a connection between the electronic device 200 and the display device 100. The electronic device 200 may execute a program or an application when the electronic device 200 and the display device 100 are connected to each other.

In operation 1620, when the electronic device 200 and the display device 100 are connected to each other, the electronic device 200 displays a list of VR images on the display 220. The list may be VR images provided from the Internet or VR images stored in the memory 240.

In operation 1630, the electronic device 200 receives, from the user, an input of selecting one VR image from the list.

In operation 1640, the electronic device 200 changes a display mode to a touch mode. The display mode denotes a state in which content, an image, or the like is provided to the display 220. The touch mode denotes a state prepared to receive a touch input from the user. A touch input of the user received in the touch mode determines a direction of the VR image. In the touch mode, the electronic device 200 may not display anything on the display 220. The electronic device 200 may receive the touch input of the user even when a screen is turned off.

In operation 1650, the electronic device 200 transmits the VR image to the display device 100, and transmits the VR image changed according to the touch input received from the user in the touch mode. The electronic device 200 may measure the distance between the electronic device 200 and the user, and determine whether to transmit the VR image, based on the measured distance. For example, the electronic device 200 may transmit the VR image when the measured distance is equal to or lower than a threshold value. The electronic device 200 does not transmit the VR image when the measured distance is higher than the threshold value.

When the measured distance is equal to or lower than the threshold value, the user may have approached the face to the display device 100 to view the VR image. When the measured distance is equal to or higher than the threshold value, the user is not viewing the VR image, and thus the electronic device 200 does not transmit the VR image.

Operations described in FIG. 16 may be stored in the memory 240 or executed by the processor 210, in a form of programs.

A user may view a VR image without having to wear a display device on the head.

The display device may be connected and fixed to an electronic device through a connection structure.

The embodiments of the present disclosure can be written as computer programs and can be implemented in general-use digital computers that execute the programs using a non-transitory computer-readable recording medium. Also, a structure of data used in the above embodiments may be recorded on the non-transitory computer-readable recording medium via various manners. Also, the above embodiments may be implemented in a form of a recording medium including instructions executable by a computer, such as a computer-executed program module. For example, methods implemented in software modules or algorithms may be stored in the non-transitory computer-readable recording medium, as computer-readable and executable codes or program commands.

The non-transitory computer-readable recording medium may be an arbitrary recording medium accessible by a computer, and examples thereof include all volatile and non-volatile media and separable and non-separable media. Examples of the non-transitory computer-readable recording medium include magnetic storage media (e.g., ROM, floppy disks, hard disks, etc.), optical recording media (e.g., CD-ROMs, or DVDs), etc. Further, examples of the non-transitory computer-readable recording medium may include a computer storage medium and a communication medium.

Also, the non-transitory computer-readable recording medium can also be distributed over network coupled computer systems, and data (for example, program instructions and codes) stored in the non-transitory computer-readable recording medium is executed by at least one computer.

Terms such as "unit" and "module" indicate a unit for processing at least one function or operation, wherein the unit and the block may be embodied as hardware or software or embodied by combining hardware and software.

The "unit" may be formed so as to be in an addressable storage medium, or may be formed so as to operate one or more processors.

For example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables.

The invention claimed is:

1. A display device comprising:
a left display and a right display that are spaced apart from each other;
a left lens group located at a rear of the left display;
a right lens group located at a rear of the right display;
a left display housing configured to surround the left display and the left lens group;
a right display housing configured to surround the right display and the right lens group;
a main frame provided between the left and right display housings;
a connection structure comprising:
   a holder configured to receive an external device and fix an external electronic device to the display device; and
   a connector configured to be electrically connected to the external electronic device,
   wherein the connection structure is configured to adjust an angle between the main frame and the connector; and
electronic components provided inside the main frame.

2. The display device of claim 1, wherein the connection structure comprises a hinge capable of adjusting a tilting angle of the main frame.

3. The display device of claim 1, wherein the connection structure comprises a bearing rotatable with respect to the main frame.

4. The display device of claim 3, further comprising a proximity sensor configured to measure a distance between the display device and a user, and
wherein the main frame is configured to fix the bearing, based on the measured distance.

5. The display device of claim 1, wherein the connection structure comprises a ball joint rotatable with respect to the main frame, and
wherein the ball joint comprises a rotatable ball and a ball housing surrounding the rotatable ball.

6. The display device of claim 5, wherein the connection structure further comprises a locking lever, and
wherein the locking lever comprises a protrusion to fix the rotatable ball by being coupled to a groove of the rotatable ball.

7. The display device of claim 5, wherein the rotatable ball comprises a magnet on a surface and the ball housing comprises an electromagnet, and
wherein the rotatable ball and the ball housing are spaced apart from each other when electricity is applied to the electromagnet while a virtual reality (VR) image is reproduced.

8. The display device of claim 5, wherein the ball housing comprises a motor and a fastener, and
wherein the rotatable ball and the ball housing are spaced apart from each other by driving the motor to unfasten the fastener while a virtual reality (VR) image is reproduced.

9. The display device of claim 1, wherein each of the left and right display housings is foldable with respect to the main frame.

10. The display device of claim 1, further comprising an assembling structure at an end of each of the left and right display housings,
wherein the left and right display housings are fixed by the assembling structure when the left and right display housings are folded.

11. The display device of claim 1, further comprising a proximity sensor configured to measure a distance between the display device and a user,
wherein the left and right displays are turned on or off according to the distance.

* * * * *